United States Patent
Djaja et al.

(10) Patent No.: US 8,076,965 B2
(45) Date of Patent: Dec. 13, 2011

(54) LOW LEAKAGE DATA RETENTION FLIP FLOP

(75) Inventors: Gregory Djaja, Phoenix, AZ (US);
Mark Slamowitz, Chandler, AZ (US);
Karthik Chandrasekharan, Chandler, AZ (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 12/082,597

(22) Filed: Apr. 10, 2008

(65) Prior Publication Data
US 2009/0256608 A1 Oct. 15, 2009

(51) Int. Cl.
*H03K 3/289* (2006.01)
(52) U.S. Cl. ........................ 327/202; 327/203
(58) Field of Classification Search .................. 327/202, 327/203
See application file for complete search history.

(56) References Cited

U.S. PATENT DOCUMENTS

| 5,982,211 | A  | * | 11/1999 | Ko | 327/202 |
| 7,123,068 | B1 | * | 10/2006 | Hoover et al. | 327/202 |
| 7,183,825 | B2 | * | 2/2007 | Padhye et al. | 327/202 |
| 2006/0152267 | A1 | * | 7/2006 | Ramprasad | 327/208 |

* cited by examiner

*Primary Examiner* — Lincoln Donovan
*Assistant Examiner* — John Poos
(74) *Attorney, Agent, or Firm* — Farjami & Farjami LLP

(57) ABSTRACT

A disclosed embodiment is a low leakage data retention flip flop comprising a master circuit for retaining data during sleep mode, wherein the master circuit is configured to receive a reduced supply voltage during the sleep mode. The flip flop includes a slave circuit having low threshold voltage transistors, where the slave circuit is turned off during the sleep mode. In various embodiments, the master circuit might utilize high threshold voltage, standard threshold voltage, or low threshold voltage transistors. Similarly, the slave circuit might utilize high threshold voltage, standard threshold voltage, or low threshold voltage transistors. To begin the sleep mode, the master circuit receives a reduced supply voltage and the slave circuit is coupled to ground and is thus turned off. During the sleep mode, the slave circuit experiences virtually no leakage current, and the master circuit experiences a reduced leakage current.

19 Claims, 3 Drawing Sheets

LOW LEAKAGE DATA RETENTION FLIP FLOP

BACKGROUND OF THE INVENTION

1. Field of the Invention

The present invention is generally in the field of semiconductor circuits. More particularly, the present invention relates to low leakage semiconductor circuits.

2. Background Art

A conventional flip flop is a memory storage device that typically retains data as long as it is powered on (or "turned on"). While merely retaining data during power on, and not in active use, the flip flop still consumes unnecessary power due to leakage current of the transistors used in the flip flop. When completely powered off, i.e. with the supply voltage being turned off, the conventional flip flop has no leakage current, but also loses stored data.

Flip flops fabricated with transistors having higher threshold voltages and using a lower supply voltage generally have lower leakage currents. However, using higher threshold voltage transistors and a lower supply voltage also results in a reduced operational speed during active use of the flip flops. Conversely, flip flops fabricated with transistors having lower threshold voltages and using a higher supply voltage generally have higher leakage currents. However, using lower threshold voltage transistors and a higher supply voltage results in an increased operational speed during active use of the flip flops.

In an application using conventional flip flops in which power consumption is a design factor, such as in a low power mobile application, flip flop power consumption due to leakage current can be reduced in conventional ways. The threshold voltages of the flip flop transistors can be increased, resulting in power savings at the cost of reduced speed. Alternately, flip flops can be turned off when not in active use, resulting in power savings at the cost of lost data. In this alternative, turning the flip flops back on may involve reading data back into the flip flops from a nonvolatile source, resulting in system and circuit complexity and lost time. In both alternatives, the use of conventional flip flops in the low power mobile application results in various disadvantages such as, for example, increased power consumption, increased complexity and cost, and/or reduced performance.

Thus, there is a need in the art for a low leakage data retention flip flop that overcomes disadvantages of conventional flip flops.

SUMMARY OF THE INVENTION

A low leakage data retention flip flop, substantially as shown in and/or described in connection with at least one of the figures, and as set forth more completely in the claims.

DETAILED DESCRIPTION OF THE INVENTION

The present invention is directed to a low leakage data retention flip flop. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
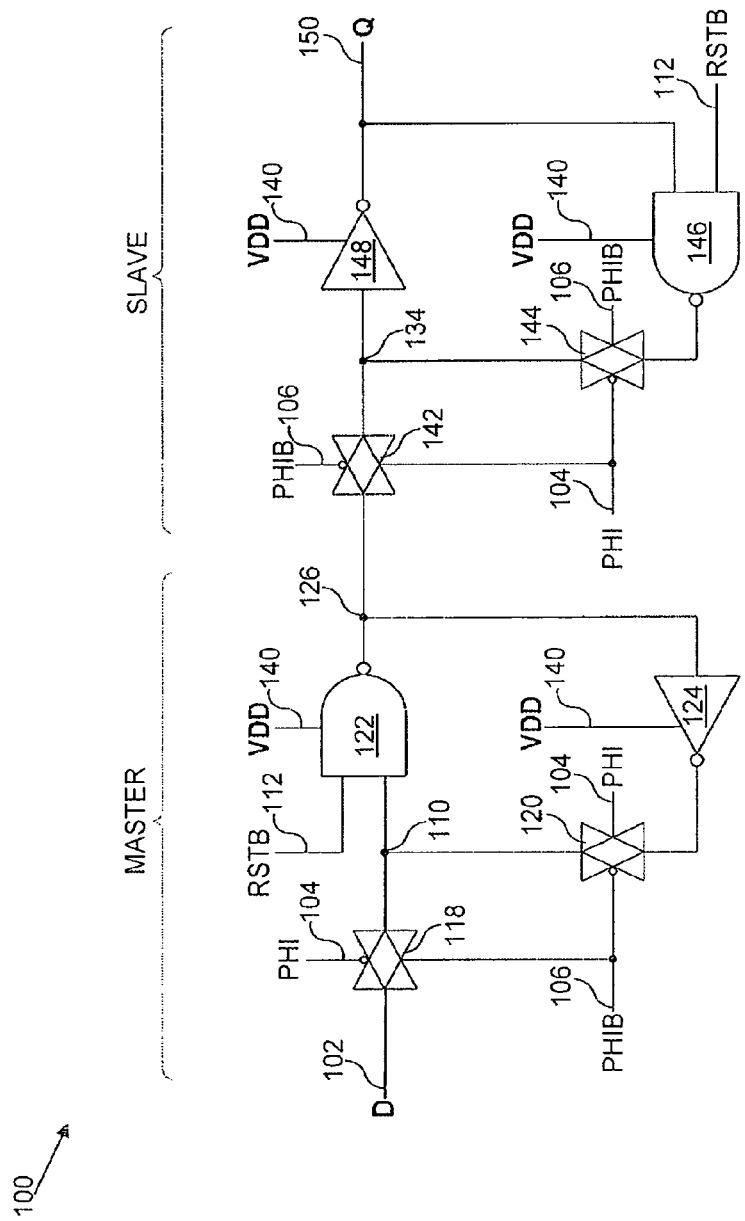
FIG. 1 shows an example of a conventional flip flop.

A conventional flip flop 100 is shown in FIG. 1. Flip flop 100 includes transmission gates 118, 120, 142, and 144. Flip flop 100 additionally includes NAND gate 122, NAND gate 146, and inverters 124 and 148. Transmission gates 118 and 120, NAND gate 122, and inverter 124 comprise a master circuit of flip flop 100, while transmission gates 142 and 144, NAND gate 146, and inverter 148 comprise a slave circuit of flip flop 100.

Flip flop 100 receives an input signal on D 102, and provides an output signal on Q 150. NAND gates 122 and 146, and inverters 124 and 148, as well as other components in flip flop 100 whose supply voltage lines are not specifically shown, receive the same supply voltage VDD 140. NAND gates 122 and 146 are also coupled to reset signal RSTB 112. Transmission gates 118, 120, 142, and 144 are controlled by opposite clock signals PHIB 106 and PHI 104 as shown in FIG. 1.

In operation, flip flop 100 is turned on when a supply voltage of, for example, 1.2 volts is provided by VDD 140. By turning off or disconnecting the supply voltage, flip flop 100 is turned off and cannot retain previously stored data. While turned on, flip flop 100 can be reset to a logical zero value at output Q 150 by pulling RSTB 112 low, but otherwise during operation RSTB 112 will be held high. Additionally, while flip flop 100 is in active use, a logical value present on D 102 will be stored in flip flop 100 and available on Q 150 in synchronization with clock signals PHIB 106 and PHI 104. For example, output Q 150 can be stable and ready for being read when PHI 104 makes a high-to-low transition, i.e. on a falling edge of PHI 104.

Typically, transmission gates 118, 120, 142, and 144 are each implemented with a pair of NMOS and PMOS transistors, although the transmission gates may be implemented differently, for example, with a single transistor, as known in the art. In the present example, transmission gate 118 comprises an NMOS transistor and a PMOS transistor with sources coupled to D 102, drains coupled to node 110, the PMOS gate coupled to clock PHI 104, and the NMOS gate coupled to clock PHIB 106. When clock PHI 104 is low and clock PHIB 106 is high, transmission gate 118 couples D 102 to node 110. Conversely, when clock PHI 104 is high and clock PHIB 106 is low, D 102 is decoupled from node 110. Transmission gate 120 can be controlled in a similar fashion by opposite clock signals PHIB 106 and PHI 104 to couple and decouple the output of inverter 124 to and from node 110.

While flip flop 100 is in active use, opposite clocks PHI 104 and PHIB 106 control the latching of a logical value present on D 102 into the master circuit of flip flop 100. When clock PHIB 106 is high (and clock PHI 104 is low), transmission gate 118 couples D 102 to node 110, allowing a logical value present on D 102 to propagate through node 110 to an input of NAND gate 122. Because RSTB 112 is held high during active use of flip flop 100, the output of NAND gate 122 is an inverted version of the logical value on D 102. The output of NAND gate 122 is provided through node 126 to the input of inverter 124, which outputs a signal that is blocked by transmission gate 120.

When clock PHIB 106 transitions from high to low, and clock PHI 104 transitions from low to high, transmission gate 118 decouples D 102 from node 110, and transmission gate 120 couples the output of inverter 124 to node 110. Thus, any change in the logical value present on D 102 is blocked by transmission gate 118. Inverter 124 becomes cross-coupled to NAND gate 122 through node 110, and thus the logical value present on D 102 prior to the clock transition of PHIB 106 and PHI 104 becomes latched in the master circuit of flip flop 100.

Opposite clocks PHI 104 and PHIB 106 also control the transfer of the logical value latched in the master circuit of flip flop 100 into the slave circuit. While clock PHIB 106 is high (and clock PHI 104 is low), transmission gate 142 decouples node 126 from node 134, i.e. decouples the master circuit of flip flop 100 from the slave circuit. Thus, after clock PHIB 106 transitions from high to low (and clock PHI 104 transitions from low to high), the logical value latched in NAND gate 122 and inverter 124 is provided through node 134 to the input of inverter 148. The output of inverter 148 is inverted by NAND gate 146, since RSTB 112 is being held high. NAND gate 146 outputs a signal that is blocked by transmission gate 144 since clock PHIB 106 is low (and clock PHI 104 is high).

When clock PHIB 106 transitions from low to high, transmission gate 142 decouples node 126 from node 134, and transmission gate 144 couples the output of NAND gate 146 to node 134. Thus, the master circuit of flip flop 100 is again decoupled from the slave circuit. NAND gate 146 becomes cross-coupled to inverter 148 through node 134, and thus the logical value latched in the master circuit prior to the low-to-high transition of clock PHIB 106 is latched in NAND gate 146 and inverter 148, i.e. in the slave circuit of flip flop 100. Consequently, the value available on Q 150 will remain stable unless the logical value present on D 102 changes and opposite clocks PHIB 106 and PHI 104 cause flip flop 100 to eventually pass on the new logical value through the master and slave circuits.

Conventional flip flop 100 may operate in the manner described above while turned on, i.e. while supply voltage VDD 140 is connected. While flip flop 100 is not in active use, i.e. while VDD 140 is connected but clocks PHIB 106 and PHI 104 are not operating to latch a new value present on D 102, flip flop 100 will retain a stored value indefinitely. However, in doing so flip flop 100 will have a continuous current leakage through the various transistors of flip flop 100, leading to significant power loss. To avoid the power loss, VDD 140 may be disconnected, but this leads to a loss of the stored value.

Figure 2:
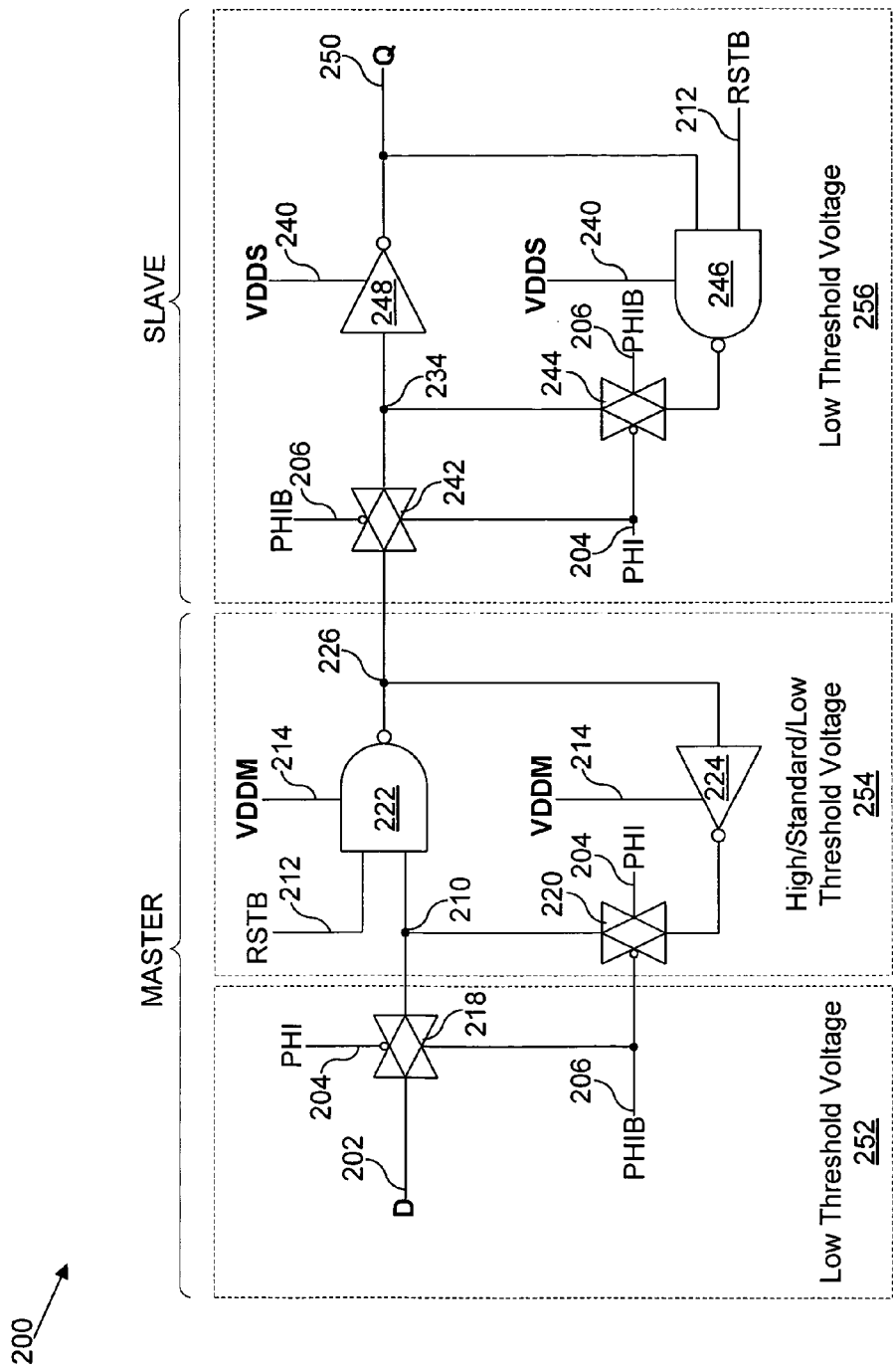
FIG. 2 shows a low leakage data retention flip flop, according to one embodiment of the present invention.

Flip flop 200, in accordance with one embodiment of the present invention, is shown in FIG. 2. Flip flop 200 includes transmission gates 218, 220, 242, and 244. Flip flop 200 additionally includes NAND gate 222, NAND gate 246, and inverters 224 and 248. Transmission gates 218 and 220, NAND gate 222, and inverter 224 comprise a master circuit of flip flop 200, while transmission gates 242 and 244, NAND gate 246, and inverter 248 comprise a slave circuit of flip flop 200. Generally, NAND gate 222, inverter 224, and transmission gate 220 can be fabricated with high, standard, or low threshold voltage transistors. Similarly, transmission gates 218, 242, and 244, inverter 248, and NAND gate 246 can be fabricated with high, standard, or low threshold voltage transistors. In one exemplary embodiment, transmission gates 218, 242, and 244, inverter 248, and NAND gate 246 are fabricated with low threshold voltage transistors, while NAND gate 222, inverter 224, and transmission gate 220 are fabricated with low threshold voltage transistors. In another exemplary embodiment, transmission gates 218, 242, and 244, inverter 248, and NAND gate 246 are fabricated with low threshold voltage transistors, while NAND gate 222, inverter 224, and transmission gate 220 are fabricated with standard threshold voltage transistors. In still another exemplary embodiment, transmission gates 218, 242, and 244, inverter 248, and NAND gate 246 are fabricated with low threshold voltage transistors, while NAND gate 222, inverter 224, and transmission gate 220 are fabricated with high threshold voltage transistors. Accordingly, FIG. 2 shows exemplary regions referred to as low threshold voltage region 252, high/standard/low threshold voltage region 254, and low threshold voltage region 256 to illustrate, as examples but without limitation, the different types of threshold voltage combinations that can be used according to the various embodiments of the present invention.

Flip flop 200 receives an input signal on D 202, and provides an output signal on Q 250. NAND gate 222, inverter 224, and other components in the master circuit of flip flop 200 whose supply voltage lines are not specifically shown receive supply voltage VDDM 214, which is a "full supply voltage" until a sleep mode is entered, after which time (i.e. after entry into the sleep mode), VDDM 214 would be at a "reduced supply voltage" as depicted in timing diagram 304 of FIG. 3 and discussed further below. NAND gate 246, inverter 248, and other components in a slave circuit of flip flop 200 whose supply voltage lines are not specifically shown receive supply voltage VDDS 240, which is a "full supply voltage" until a sleep mode is entered, after which time (i.e. after entry into the sleep mode), VDDS 240 would be "turned off," i.e. would be at ground level, as depicted in timing diagram 306 of FIG. 3 and discussed further below. NAND gates 222 and 246 also receive reset signal RSTB 212 as shown in FIG. 2. Transmission gates 218, 220, 242, and 244 are controlled by opposite clock signals PHIB 206 and PHI 204.

Figure 3:
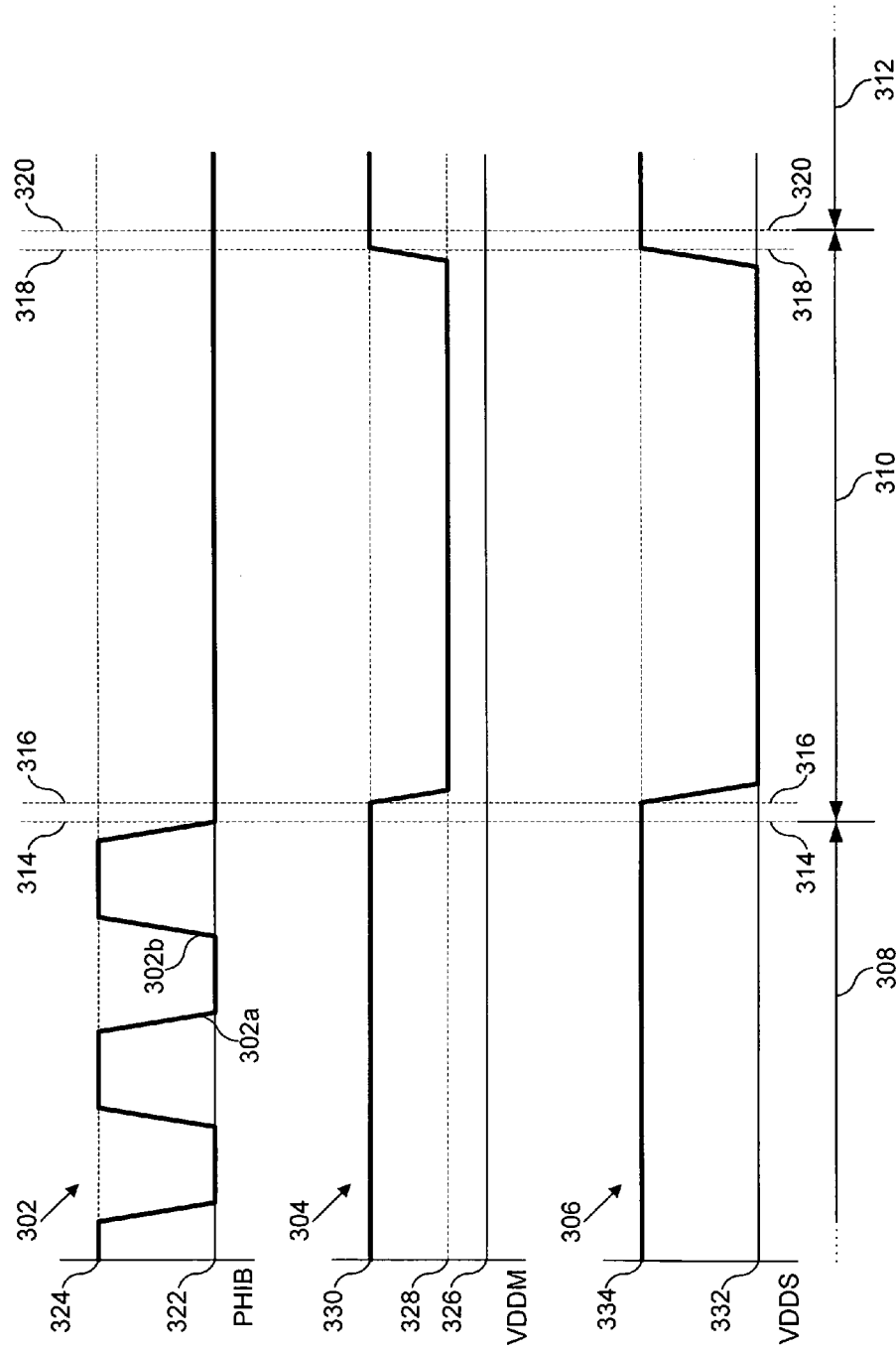
FIG. 3 shows timing diagrams for a low leakage data retention flip flop, according to one embodiment of the present invention.

In operation, flip flop 200 is on and in active use when full supply voltages, for example full supply voltages represented by voltage levels 330 and 334 of FIG. 3, are provided by VDDM 214 and VDDS 240, respectively. In one embodiment, full supply voltage levels 330 and 334 can be approximately 1.2 volts, but in other embodiments the full supply voltage levels may be different. While turned on, flip flop 200 can be reset to store a logical zero value at output Q 250 by pulling RSTB 112 low, but otherwise during operation RSTB 112 will be held high. Additionally, while flip flop 200 is in active use, a logical value present on D 202 will be stored in flip flop 200 and available on Q 250 in synchronization with clock signals PHIB 206 and PHI 204. For example, output Q 250 can be stable and ready for being read when PHI 204 makes a high-to-low transition, i.e. on a falling edge of PHI 204.

As with flip flop 100, typically transmission gates 218, 220, 242, and 244 are each implemented with a pair of NMOS and PMOS transistors, although the transmission gates may be implemented differently, for example, with a single transistor, as known in the art. In the present example, transmission gate 218 comprises an NMOS transistor and a PMOS transistor with sources coupled to D 202, drains coupled to node 210, the PMOS gate coupled to clock PHI 204, and the NMOS gate coupled to clock PHIB 206. When clock PHI 204 is low and clock PHIB 206 is high, transmission gate 218 couples D 202 to node 210. Conversely, when clock PHI 204 is high and clock PHIB 206 is low, D 202 is decoupled from node 210.

Transmission gate 220 can be controlled in a similar fashion by opposite clock signals PHIB 206 and PHI 204 to couple and decouple the output of inverter 224 to and from node 210.

While flip flop 200 is in active use, opposite clocks PHI 204 and PHIB 206 control the latching of a logical value present on D 202 into the master circuit of flip flop 200. Clock signal PHIB 206 is depicted in timing diagram 302 in FIG. 3 (opposite clock signal PHI 204 is not depicted in FIG. 3, but it is understood to those skilled in the art that clock signal PHI 204 is generally an inverse of clock signal PHIB 206). When PHIB 206 is high, i.e. is at voltage level 324 and prior to clock falling edge 302a, transmission gate 218 couples D 202 to node 210, allowing a logical value present on D 202 to propagate through node 210 to an input of NAND gate 222. Because RSTB 212 is held high during active use of flip flop 200, the output of NAND gate 222 is an inverted version of the logical value on D 202. The output of NAND gate 222 is provided through node 226 to the input of inverter 224, which outputs a signal that is blocked by transmission gate 220.

When clock PHIB 206 transitions from high to low (as depicted in falling clock edge 302a), and PHI 204 transitions from low to high, transmission gate 218 decouples D 202 from node 210, and transmission gate 220 couples the output of inverter 224 to node 210. Thus, any change in the logical value present on D 202 is blocked by transmission gate 218. Inverter 224 becomes cross-coupled to NAND gate 222 through node 210, and thus the value present on D 202 prior to the clock transition of PHIB 206 and PHI 204, i.e. prior to falling clock edge 302a, becomes latched in the master circuit of flip flop 200.

Opposite clocks PHI 204 and PHIB 206 also control the transfer of the logical value latched in the master circuit of flip flop 200 into the slave circuit. While clock PHIB 206 is high (and clock PHI 204 is low), transmission gate 242 decouples node 226 from node 234, i.e. decouples the master circuit of flip flop 200 from the slave circuit. Thus, after clock PHIB 206 transitions from high to low (and clock PHI 204 transitions from low to high), i.e. after falling clock edge 302a, the logical value latched in NAND gate 222 and inverter 224 is provided through node 234 to the input of inverter 248. The output of inverter 248 is inverted by NAND gate 246, since RSTB 232 is being held high. NAND gate 246 outputs a signal that is blocked by transmission gate 244 since clock PHIB 206 is low (and clock PHI 204 is high).

When clock PHIB 206 transitions from low to high, i.e. makes a low-to-high transition as depicted in rising clock edge 302b, transmission gate 242 decouples node 226 from node 234, and transmission gate 244 couples the output of NAND gate 246 to node 234. Thus, the master circuit of flip flop 200 is again decoupled from the slave circuit. NAND gate 246 becomes cross-coupled to inverter 248 through node 234, and thus the logical value latched in the master circuit prior to the low-to-high transition of clock PHIB 206 is latched in NAND gate 246 and inverter 248, i.e. in the slave circuit of flip flop 200. Consequently, the value available on Q 250 will remain stable unless the logical value present on D 202 changes and opposite clocks PHIB 206 and PHI 204 cause flip flop 200 to eventually pass on the new logical value through the master and slave circuits.

After storing a logical value in flip flop 200 during active use in operational period 308, flip flop 200 can be placed into a low current leakage sleep mode in sleep period 310. Unlike conventional flip flop 100, the invention's flip flop 200 can retain a stored value while the flip flop is not in active use, i.e. in sleep period 310, without resulting in a significant power loss. Further, the invention's flip flop 200 maintains a high speed when the flip flop is in active use, i.e. in operational period 308. These advantages are achieved in part by varying VDDM 214 during sleep mode, turning off (i.e. lowering to ground level) VDDS 240 during sleep mode. Moreover, to preserve high operational speed, the slave circuit of flip flop 200 and transmission gate 218 in the master circuit are fabricated using low threshold voltage transistors, shown as low threshold voltage regions 256 and 252 in FIG. 2.

To place flip flop 200 into a data retaining low current leakage sleep mode, clock PHIB 206 is forced low and held low at time 314, as depicted in timing diagram 302 (conversely, clock PHI 204 is held high). Transmission gate 218 thus decouples D 202 from node 210. Subsequently, VDDM 214 is reduced from full supply voltage level 330 to reduced supply voltage level 328 at time 316, as depicted in timing diagrams 304. As shown in timing diagram 304, reduced supply voltage level 328 is less than full supply voltage level 330 but greater than ground voltage level 326. Moreover, VDDS 240 is reduced from full supply voltage level 334 to ground voltage level 332 at time 316, as depicted in timing diagrams 306, thus turning off the slave circuit in flip flop 200. Thus, in the sleep mode, the slave circuit has virtually no leakage current. In one embodiment of the invention, full supply voltage levels 330 and 334 are approximately 1.2 volts relative to ground voltage levels 326 and 332 that are 0.0 volts. In one embodiment of the invention, reduced supply voltage level 328 is approximately 0.6 volts. Different embodiments of the invention can utilize different full and reduced supply voltage levels.

After reducing VDDS 240 from fully supply voltage level 334 to ground voltage level 332, inverter 248 and NAND gate 246 in the slave circuit of flip flop 200 are turned off. Thus, the slave circuit no longer retains a logical value stored previously during operational period 308, and Q 250 is allowed to float. However, because VDDM 214 was lowered only to reduced supply voltage level 328, instead of to ground voltage level 326, inverter 224 and NAND gate 222 in the master circuit of flip flop 200 remain turned on during sleep period 310. Thus, in the sleep mode, VDDM 214 is sufficiently above ground voltage level 326 so that the master circuit continues to retain a logical value stored during operational period 308, but current leakage is greatly reduced.

Current leakage is reduced during sleep period 310 not only by reducing VDDM 214, but also by using high threshold voltage transistors in NAND gate 222, inverter 224, and transmission gate 220. In one exemplary embodiment, the transistors in high/standard/low threshold voltage region 254 are high threshold voltage transistors having a threshold voltage of about 0.5 volts. In other exemplary embodiments, the transistors in high/standard/low threshold voltage region 254 are standard threshold voltage transistors having a threshold voltage of about 0.4 volts, or low threshold voltage transistors having a threshold voltage of about 0.3 volts. In various embodiments, due to reduced supply voltage level 328 in sleep period 310, current leakage in flip flop 200 is significantly reduced.

Moreover, because transmission gates 218, 242, and 244, inverter 248, and NAND gate 246 are turned off during sleep period 310, they can be fabricated with a low threshold voltage, as depicted by low threshold voltage regions 252 and 256. In one embodiment, the transistors in low threshold voltage regions 252 and 256 have a threshold voltage of about 0.3 volts. Transistors in low threshold voltage regions 252 and 256 also enjoy the benefit of additional speed during operational periods 308 and 312, when flip flop 200 is not in a sleep mode.

After sleep period 310, i.e. during operational period 312, flip flop 200 is taken out of the low current leakage sleep mode. At time 318, VDDM 214 can be raised from reduced supply voltage level 328 to full supply voltage level 330, and VDDS 240 can be raised from ground voltage level 332 to full supply voltage level 334. Thus, NAND gate 246 and inverter 248 are turned back on, and because clock PHIB 206 is still low (and clock PHI 204 is still high), inverter 248 is coupled to the retained data in the master circuit of flip flop 200 through transmission gate 242. After an appropriate setup or propagation time, the retained data is available on Q 250 at time 320, and flip flop 200 is ready for active use.

In this manner, the invention's flip flop 200 can retain a stored value while the flip flop is not in active use, i.e. while the flip flop is in a sleep mode, without resulting in a significant power loss. Further, the invention's flip flop 200 maintains a high speed when the flip flop is in active use. As discussed above, these advantages are achieved in part by appropriately lowering the supply voltage provided to the master circuit during the sleep mode, turning off (i.e. lowering to ground level) the supply voltage provided to the slave circuit during the sleep mode, and also by the advantageous fabrication of the slave circuit with low threshold voltage transistors.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a low leakage data retention flip flop has been described.

The invention claimed is:

1. A low leakage data retention flip flop comprising:
a master circuit for retaining data during a sleep mode, said master circuit being configured to receive a reduced supply voltage during said sleep mode, said master circuit not turned off during said sleep mode, said master circuit comprising transistors selected from the group consisting of low threshold voltage, standard threshold voltage, and high threshold voltage transistors;
a slave circuit configured to be turned off during said sleep mode.

2. The flip flop of claim 1 wherein said slave circuit comprises transistors selected from the group consisting of low threshold voltage, standard threshold voltage, and high threshold voltage transistors.

3. The flip flop of claim 1, wherein said high threshold voltage transistors have a threshold voltage lower than said reduced supply voltage.

4. The flip flop of claim 1, wherein said master circuit is configured to receive a full supply voltage to end said sleep mode.

5. The flip flop of claim 1, wherein said sleep mode is ended when said slave circuit is turned on.

6. The flip flop of claim 5, wherein said slave circuit is configured to receive a full supply voltage to end said sleep mode.

7. The flip flop of claim 5, wherein said slave circuit receives data retained by said master circuit when said sleep mode is ended.

8. The flip flop of claim 1, wherein said slave circuit receives data retained by said master circuit when said sleep mode is ended.

9. The flip flop of claim 1, wherein said slave circuit has substantially no leakage current during said sleep mode.

10. The flip flop of claim 1, wherein said reduced supply voltage is a voltage less than a full supply voltage and greater than a ground voltage.

11. A low leakage data retention flip flop comprising:
a master circuit for retaining data during a sleep mode, said master circuit not turned off and not fully powered during said sleep mode, said master circuit comprising transistors selected from the group consisting of low threshold voltage, standard threshold voltage, and high threshold voltage transistors;
a slave circuit having a plurality of low threshold voltage transistors.

12. The flip flop of claim 11, wherein said master circuit is configured to receive a reduced supply voltage during said sleep mode.

13. The flip flop of claim 12, wherein said high threshold voltage transistors have a threshold voltage lower than said reduced supply voltage.

14. The flip flop of claim 12, wherein said reduced supply voltage is a voltage less than a full supply voltage and greater than a ground voltage.

15. The flip flop of claim 11, wherein said slave circuit is configured to be turned off during said sleep mode.

16. The flip flop of claim 15, wherein said sleep mode is ended when said slave circuit is turned on.

17. The flip flop of claim 15, wherein said slave circuit has substantially no leakage current during said sleep mode.

18. The flip flop of claim 11, wherein said master circuit is configured to receive a full supply voltage to end said sleep mode.

19. The flip flop of claim 11, wherein said slave circuit receives data retained by said master circuit when said sleep mode is ended.

* * * * *